(12) United States Patent
Piselli et al.

(10) Patent No.: US 9,337,824 B2
(45) Date of Patent: May 10, 2016

(54) DRIVE CIRCUIT WITH ADJUSTABLE DEAD TIME

(75) Inventors: Marco Piselli, Padua (IT); Simone Massaro, Venzia (IT); Michael Lenz, Zorneding (DE); Marco Puerschel, Munich (DE); Dusan Graovac, Munich (DE)

(73) Assignee: Infineon Technologies Austria AG, Villach (AT)

( * ) Notice: Subject to any disclaimer, the term of this patent is extended or adjusted under 35 U.S.C. 154(b) by 821 days.

(21) Appl. No.: 13/181,587

(22) Filed: Jul. 13, 2011

(65) Prior Publication Data

US 2013/0015887 A1    Jan. 17, 2013

(51) Int. Cl.
*H03K 17/28*    (2006.01)
*H03K 17/16*    (2006.01)

(52) U.S. Cl.
CPC .............. *H03K 17/28* (2013.01); *H03K 17/162* (2013.01); *H03K 2217/0063* (2013.01); *H03K 2217/0072* (2013.01)

(58) Field of Classification Search
CPC ................ H03K 17/28; H03K 17/162; H03K 2217/0063; H03K 2217/0072
USPC .......... 327/108, 419, 423; 323/271, 282, 283, 323/285, 351; 363/50
See application file for complete search history.

(56) References Cited

U.S. PATENT DOCUMENTS

| | | | | |
|---|---|---|---|---|
| 5,353,212 A | * | 10/1994 | Loftus, Jr. | 363/17 |
| 6,002,213 A | * | 12/1999 | Wood | 315/307 |
| 6,002,601 A | * | 12/1999 | Pappalardo et al. | 363/71 |
| 6,614,208 B2 | * | 9/2003 | Narita | 323/283 |
| 7,323,825 B2 | * | 1/2008 | Hwang et al. | 315/224 |
| 7,400,163 B2 | * | 7/2008 | Yanagigawa et al. | 326/26 |
| 7,504,816 B2 | * | 3/2009 | Laur et al. | 323/354 |
| 7,508,142 B2 | * | 3/2009 | Green | 315/224 |
| 7,683,594 B2 | * | 3/2010 | Kim et al. | 323/282 |
| 7,724,054 B2 | | 5/2010 | Honda et al. | |
| 7,777,533 B2 | * | 8/2010 | Miyamoto et al. | 327/112 |
| 8,194,424 B2 | * | 6/2012 | Stanley | 363/21.17 |
| 2008/0298101 A1 | | 12/2008 | Kim et al. | |
| 2010/0259954 A1 | | 10/2010 | Santoro et al. | |

FOREIGN PATENT DOCUMENTS

CN      101345474 A    1/2009
DE   102005042781 A1    8/2006

* cited by examiner

*Primary Examiner* — Jung Kim
(74) *Attorney, Agent, or Firm* — Murphy, Bilak & Homiller, PLLC

(57) ABSTRACT

A drive circuit includes a first input terminal configured to receive a first input signal, a first output terminal configured to provide a first drive signal, a second output terminal configured to provide a second drive signal, and a mode selection terminal configured to have a mode selection element connected thereto. The drive circuit is configured to generate the first and second drive signals dependent on the first input signal such that there is a dead time between a time when one of the first and second drive signals assumes an off-level and a time when the other one of the first and second drive signals assumes an on-level, and evaluate at least one electrical parameter of the mode selection element and is configured to adjust a first signal range of the first drive signal and a second signal range of the second drive signal dependent on the evaluated parameter and to adjust the dead time dependent on the evaluated parameter.

25 Claims, 9 Drawing Sheets

DRIVE CIRCUIT WITH ADJUSTABLE DEAD TIME

TECHNICAL FIELD

Embodiments of the present invention relate to a drive circuit, in particular a drive circuit for a half-bridge.

BACKGROUND

A half-bridge includes two electronic switches, a first electronic switch, which is also referred to as high-side switch, and a second electronic switch, which is also referred to as low-side switch. The switches have their load paths connected in series, where in operation of the half-bridge the series circuit with the two switches is connected between terminals for a first supply potential and a second supply potential. An output of the half-bridge may be formed by a circuit node that is common to the load paths of the two switches.

Half-bridges can be employed in a wide range of different applications, such as motor drive circuits, switched-mode power supplies, or full-bridges (H-bridges) including two half-bridges. The electronic switches employed in a half-bridge are, for example, MOS transistors, such as MOSFETs (metal oxide semiconductor field effect transistors) or IGBTs (insulated gate bipolar transistors).

MOS transistors are voltage controlled device that can be switched on and off by applying a suitable gate drive voltage between a gate terminal acting as a control terminal and a source terminal (in a MOSFET) or an emitter terminal (in an IGBT). A plurality of different types of MOS transistors are available that have different voltage blocking capabilities, from several 10V up to several kV (kilovolts), different on-resistances, and/or different threshold voltages. The "threshold voltage" is the gate drive voltage at which the MOS transistor starts to conduct. Usually, MOS transistors with a low voltage blocking capability have a low threshold voltage, while MOS transistors with a high voltage blocking capability have a high threshold voltage. The absolute value of the gate drive voltage to be applied in order to completely switch an MOS transistor on, so that the on-resistance has a minimum, is higher than the threshold voltage. There are MOS transistors that can be switched on an off using logic level drive signals with a maximum signal level of 5V or 3.3V, while other MOS transistors require gate drive voltages with higher maximum voltage levels.

In order to prevent a current shoot-through when the half-bridge is in operation, the two switches should be driven such that they are not switched on (in an on-state) at the same time. Further, there should be a dead time between a time of switching off one of the two switches and a time of switching on the other one of the two switches.

There is a need to provide a drive circuit, in particular a drive circuit for driving a half-bridge, that is configured to generate a first and a second drive signal with adjustable drive signal ranges and with an adjustable dead time.

SUMMARY

According to a first embodiment, a drive circuit includes a first input terminal configured to receive a first input signal, a first output terminal configured to provide a first drive signal, a second output terminal configured to provide a second drive signal, and a mode selection terminal configured to have a mode selection element connected thereto. The drive circuit is configured to generate the first and second drive signals dependent on the first input signal such that there is a dead time between a time when one of the first and second drive signals assumes an off-level and a time when the other one of the first and second drive signals assumes an on-level. The drive circuit is further configured to evaluate at least one electrical parameter of the mode selection element and is configured to adjust a first signal range of the first drive signal and a second signal range of the second drive signal dependent on the evaluated parameter and to adjust the dead time dependent on the evaluated parameter.

According to a second embodiment, a drive circuit includes a first input terminal configured to receive a first input signal, a second input terminal configured to receive a second input signal, a first output terminal configured to provide a first drive signal, a second output terminal configured to provide a second drive signal, and a mode selection terminal configured to have a mode selection element connected thereto. The drive circuit is configured to assume one of an internal dead-time generation mode in which the first and second drive signals are generated dependent on the first input signal such that there is a dead time between a time when one of the first and second drive signals assumes an off-level and a time when the other one of the first and second drive signals assumes an on-level, and an external dead-time generation mode in which the first drive signal is dependent on the first input signal and in which the second drive signal is dependent on the second input signal. The drive circuit is further configured to evaluate at least one electrical parameter of the mode selection element and is configured to adjust the internal dead-time generation mode or the external dead-time generation mode dependent on the evaluated parameter.

Those skilled in the art will recognize additional features and advantages upon reading the following detailed description, and upon viewing the accompanying drawings.

BRIEF DESCRIPTION OF THE DRAWINGS

Embodiments will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

For illustration purposes, embodiments of the present invention are explained in detail below. These embodiments relate to a drive circuit. The drive circuit is explained in a specific context, namely in the context of driving a half-bridge. However, this is only an example. The drive circuit may be used in connection with any other circuit application in which driving two electronic switches is required.

Figure 1:
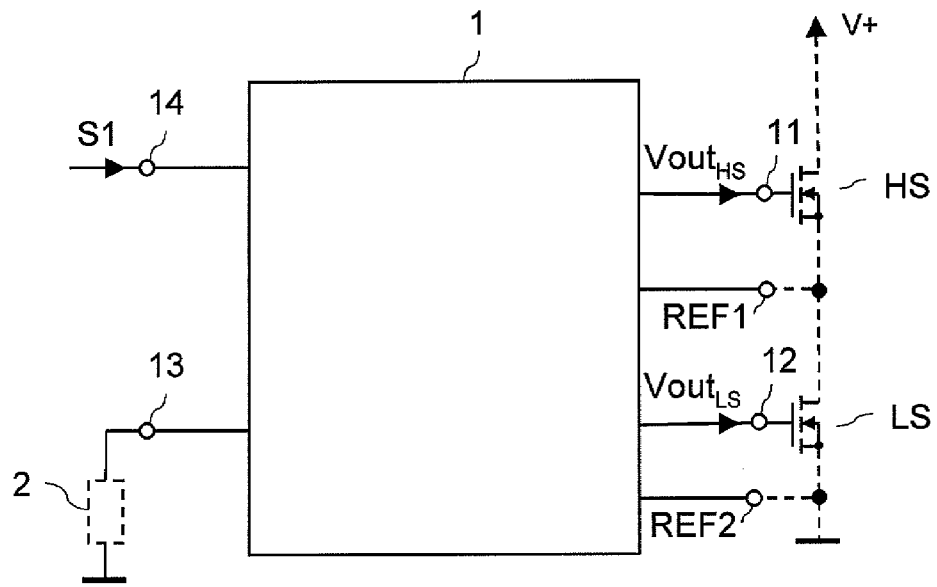
FIG. 1 schematically illustrates an embodiment of a drive circuit generating first and second drive signals.

FIG. 1 schematically illustrates a first embodiment of a drive circuit 1 that is configured to drive two electronic switches, such as two electronic switches of a half-bridge. For illustration purposes a half-bridge is also illustrated (in dashed lines) in FIG. 1. The half-bridge includes a first electronic switch HS that is also referred to as a high-side switch, and a second electronic switch LS that is also referred to as a low-side switch. The two electronic switches HS, LS each have a control terminal and an internal load path between a first and a second load terminal. The load paths of the two electronic switches HS, LS are connected in series, where in operation of the half-bridge the series circuit with the load paths of the two electronic switches HS, LS is connected between supply terminals for a positive supply potential V+ and a negative supply potential or reference potential GND, respectively. The half-bridge further includes an output terminal that is formed by a circuit node that is common to the load paths of the two electronic switches HS, LS. A load Z may be connected to the output terminal of the half-bridge. The load Z is, e.g., a motor, an inductive load, such as a magnetic valve, a rectifier circuit in a switched-mode power supply, a rectifier circuit including a lamp in a lamp ballast circuit, and the like.

In the embodiment illustrated in FIG. 1, the electronic switches HS, LS of the half-bridge are implemented as MOSFETs, specifically as n-type MOSFETs. These MOSFETs have a drain-source path forming a load path between a drain and source terminal, and a gate terminal forming a control terminal. It should be noted that implementing the half-bridge with two n-type MOSFETs is only an example. The half-bridge could also be implemented with other types of MOS transistors, such as p-type MOSFETs or IGBTs. Further, the half-bridge may be implemented with complementary MOSFETs, so that one of the two electronic switches, such as the low-side switch LS, is an n-type MOSFET, while the other one of the two electronic switches, such as the high-side switch HS, is a p-type MOSFET.

The drive circuit 1 includes a first output terminal 11 for providing a first drive signal $Vout_{HS}$, a second output terminal 12 for providing a second drive signal $Vout_{LS}$, a first input terminal 14 for receiving a first input signal S1, and a mode selection terminal 13 configured to have a mode selection element 2 connected thereto. The mode selection element 2 is illustrated in dashed lines in FIG. 1. The mode selection element 2 is, e.g., a passive device having at least one electrical parameter. The mode selection element 2 is, for example, a resistor having a resistance as electrical parameter, a coil having an inductance as electrical parameter, or a capacitor having a capacitance as electrical parameter. The mode selection element 2 can also be implemented with two or more passive components.

In the embodiment illustrated in FIG. 1, the drive circuit 1 generates a gate drive voltage of the high-side switch HS as the first drive signal $Vout_{HS}$, and a gate drive voltage of the low-side switch LS as the second drive signal $Vout_{LS}$. In this case, the first drive signal $Vout_{HS}$ is a voltage between the first output terminal 11 and a first reference terminal REF1, and the second drive signal $Vout_{LS}$ is a voltage between the second output terminal 12 and a second reference terminal REF2. In the circuit application illustrated in FIG. 1, the first output terminal 11 of the drive circuit 1 is coupled to the gate terminal of the high-side switch HS, the first reference terminal REF1 is coupled to the source terminal of the high-side switch HS, the second output terminal 12 is coupled to the gate terminal of the low-side switch LS, and the second reference terminal REF2 is coupled to the source terminal of the low-side switch LS.

Figure 2:
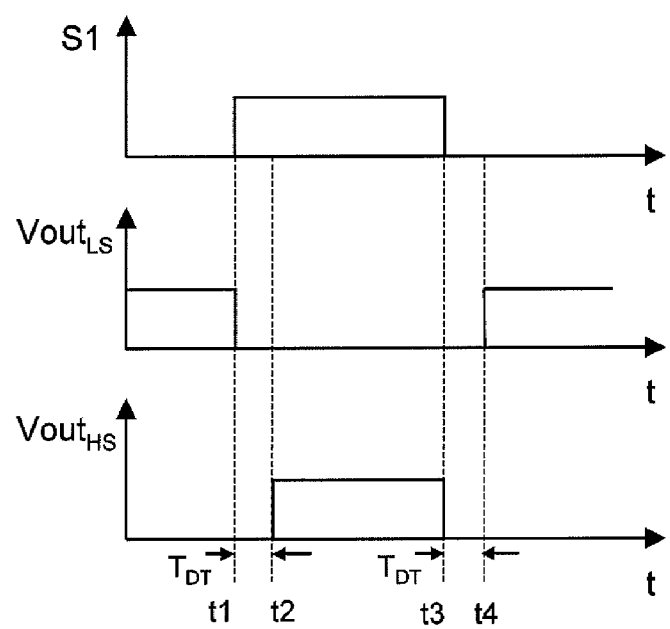
FIG. 2 shows timing diagrams illustrating the operating principle of the drive circuit of FIG. 1.

The drive circuit 1 is configured to generate the first and second drive signals $Vout_{HS}$, $Vout_{LS}$ dependent on the first input signal S1 such that there is a dead time between an off-level of one of the first and second drive signals $Vout_{HS}$, $Vout_{LS}$ and an on-level of the other one of the first and second drive signals $Vout_{HS}$, $Vout_{LS}$. This is explained in more detail with reference to FIG. 2, in which timing diagrams of the first input signal S1, and the first and second drive signals $Vout_{HS}$, $Vout_{LS}$ are schematically illustrated. The first and second drive signals $Vout_{HS}$, $Vout_{LS}$ can each assume an on-level and an off-level. An on-level of a drive signal $Vout_{HS}$, $Vout_{LS}$ is a signal level at which the corresponding electronic switch HS, LS is switched on, and an off-level is a signal level at which the corresponding electronic switch HS, LS is switched off. In FIG. 2, on-levels of the drive signals $Vout_{HS}$ are represented by high signal levels, while off-levels are represented by low signal levels. However, this is only an example. On-levels could as well be represented by low levels, while off-levels could be represented by high levels.

The first input signal S1 can assume a first signal level, which is a high-signal level in the example according to FIG. 2, and a second signal level, which is a low-signal level in the example of FIG. 2. For explanation purposes it is assumed that the first drive signal $Vout_{HS}$ assumes an on-level in order to switch the high-side switch HS on when the first input signal S1 assumes the first signal level, and that the first drive signal $Vout_{HS}$ assumes an off-level in order to switch the high-side switch HS off when the first input signal S1 assumes the second signal level. Further, the high-side switch HS and the low-side switch LS are switched on complementary, so that the two switches are not switched on at the same time. Thus, the second drive signal $Vout_{LS}$ has an off-level when the first input signal S1 has the first signal level, and the second drive signal $Vout_{LS}$ has an on-level when the first input signal S1 has the second signal level.

Referring to FIG. 2, the drive circuit 1 is further configured to generate a dead time $T_{DT}$ between a time when one of the first and second drive signals $Vout_{HS}$, $Vout_{LS}$ assumes an off-level and a time when the other one of the first and second drive signals $Vout_{HS}$, $Vout_{LS}$ assumes an on-level. In FIG. 2, two scenarios in which a dead time $T_{DT}$ is generated, are illustrated. In FIG. 2, t1 denotes a time at which the first input signal S1 assumes the first signal level, so that the first drive signal $Vout_{LS}$ assumes the off-level. An on-level of the second drive signal $Vout_{HS}$ is generated at a later time t2, where there is a time delay corresponding to the dead time $T_{DT}$ between times t1 and t2. Equivalently, a dead time $T_{DT}$ is generated between a time t3 at which the input signal S1 assumes the second signal level so that the first drive signal $Vout_{HS}$ assumes its off-level and a time t4 at which the second drive signal $Vout_{LS}$ assumes an on-level.

Figure 3:
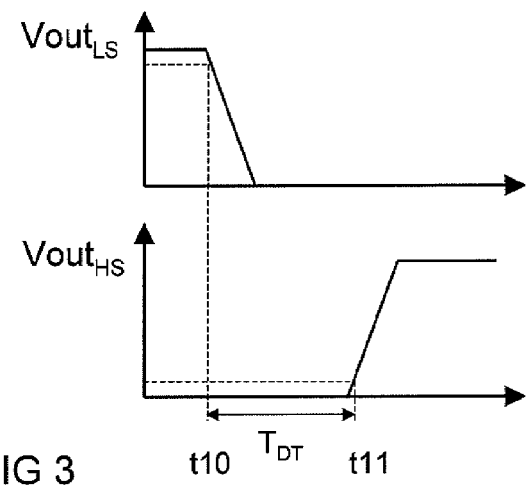
FIG. 3 shows timing diagrams illustrating a dead time between an off-level of one of the first and second drive signals and an on-level of the other one of the first and second drive signals.

In FIG. 2, the signal waveforms of the input signal S1 and the first and second drive signals $Vout_{HS}$, $Vout_{LS}$ are schematically illustrated with vertical rising and vertical falling edges. However in particular rising and falling edges of the first and second drive signals $Vout_{HS}$, $Vout_{LS}$ may not be vertical, which is illustrated in FIG. 3. This is because a change of a signal level of these signals involves a charging or discharging of an internal gate-source capacitance of the MOSFETs HS, LS which takes some time. In this case, the dead time $T_{DT}$ is, for example, the time period between a time (t10 in FIG. 3) at which the drive signal of the switch that is to be switched off has fallen to a first threshold value and a time (t11 in FIG. 3) at which the drive signal of the switch that is to be switched on has increased to a second threshold value. In the example illustrated in FIG. 3, the first drive signal $Vout_{HS}$ has a falling edge, where the first threshold value is 90% of the maximum signal value of the first drive signal $Vout_{HS}$, and the second drive signal $Vout_{LS}$ has a rising edge, where the second threshold value is 10% of a maximum signal level of the second drive signal $Vout_{LS}$.

A plurality of different types of MOS-transistors are available that can be employed as a high-side switch HS and a low-side switch LS in the half-bridge. These different types of MOS-transistors may have different voltage blocking capabilities, different on-resistances, and/or different threshold voltages. Consequently, different signal ranges, in particular different maximum signal levels, of the first and second drive signals $Vout_{HS}$, $Vout_{LS}$ are necessary in order to be able to suitably drive these different types of MOS-transistors. There are MOS-transistors that can be driven using logic signals. These MOSFETs are also referred to as "logic level" MOSFETs. And there are MOS-transistors that require higher drive signal levels. These MOSFETs are also referred to as "normal level" MOSFETs. Normal level transistors may have (but not necessarily need to have) higher voltage capabilities than logic level transistors.

Logic signals are, for example, signals having signal ranges between 0V and 5V or between 0V and 3.3V. Higher signal ranges are, for example, signal ranges between 0V and 10V or 0V and 15V.

The drive circuit of FIG. 1 is configured to adjust the dead time $T_{DT}$ as well as the signal ranges of the first and second drive signals $Vout_{HS}$, $Vout_{LS}$ dependent on the at least one electrical parameter of the mode selection element 2. This enables a user to configure the drive circuit 1 in consideration of the MOS-transistors to be driven and in consideration of the required dead time. Configuration of the drive circuit 1 therefore involves connecting the mode selection element 2 with a suitable electrical parameter to the mode selection terminal 13.

Figure 4:
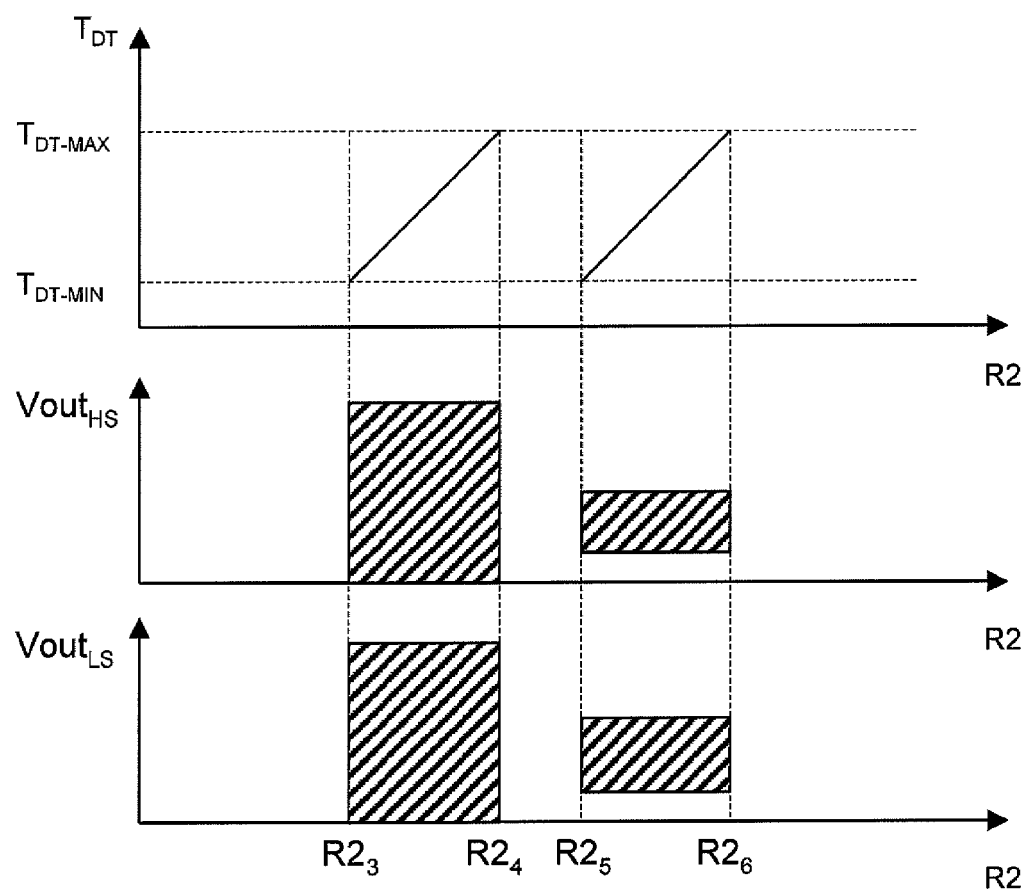
FIG. 4 illustrates the operating principle of the drive circuit as to the generation of the dead time and as to the selection of signal ranges of first and second drive signals.

The operating principle of the drive circuit 1 as to the selection of the dead time $T_{DT}$ and as to the selection of the signal ranges of the first and second drive signals is now explained with reference to FIG. 4. In FIG. 4 the dead time $T_{DT}$ and the signal ranges of the first and second drive signals $Vout_{HS}$, $Vout_{LS}$ are shown dependent on the at least one electrical parameter R2 of the mode selection element 2. According to one embodiment, the electrical parameter R2 is the electrical resistance of the mode selection element 2.

Referring to FIG. 4, the drive circuit 1 is configured to operate in two different operation modes dependent on the electrical parameter R2, namely (a) a first operation mode in which the first drive signal $Vout_{HS}$ has a first signal range, and the second drive signal $Vout_{LS}$ has a second signal range, and (b) a second operation mode in which the first drive signal $Vout_{HS}$ has a third signal range and the second drive signal $Vout_{LS}$ has a fourth signal range. The drive circuit 1 is in the first operation mode when the parameter R2 is in a first parameter interval [$R2_3$, $R2_4$], and the drive circuit 1 is in the second operation mode when the parameter R2 is in a second parameter interval [$R2_5$, $R2_6$]. The two parameter intervals do not overlap, which means that none of the parameter values included in one of the intervals is also included in the other interval. In the embodiment illustrated in FIG. 4, there is a safety margin between the two intervals in that a parameter value $R2_5$ representing a lower border of the second interval is larger than a parameter value $R2_4$ representing an upper border of the first interval. However, this is only an example. The two intervals could also adjoin one another. In this case, the parameter values representing the lower border of the second interval and the upper border of the first interval would be equal, i.e. $R2_4=R2_5$.

In each of the two operation modes, the dead time $T_{DT}$ is dependent on the electrical parameter R2. In the specific embodiment illustrated in FIG. 4, the dead time $T_{DT}$ rises linearly with the electrical parameter R2 within the first and second parameter intervals [$R2_3$, $R2_4$] and [$R2_5$, $R2_6$]. Thus, by selecting a mode selection element 2 having an electrical parameter value that is within the first interval [$R2_3$, $R2_4$] the signal range of the first drive signal $Vout_{HS}$ will be the first signal range, the signal range of the second drive signal $Vout_{LS}$ will be the second signal range, and the dead time $T_{DT}$ will be the dead time $T_{DT}$ defined by the parameter value according to the characteristic curve illustrated in the uppermost diagram in FIG. 4. Equivalently, selecting a mode selection element 2 that has an electrical parameter in the second interval [$R2_5$, $R2_6$] results in the signal range of the first drive signal $Vout_{HS}$ being the third signal range, the signal range of the second drive signal $Vout_{LS}$ being the fourth signal range, and the dead time $T_{DT}$ being the dead time defined by the electrical parameter according to the characteristic curve.

In FIG. 4, the first, second, third and fourth signal ranges are only schematically illustrated. Each signal range is defined by a minimum signal value and a maximum signal value. According to one embodiment, the first and second signal ranges, which are the signal ranges of the first and second drive signals $Vout_{HS}$, $Vout_{LS}$ in the first operation mode, are equal, and the third and fourth signal ranges, which are the signal ranges of the first and second drive signals $Vout_{HS}$, $Vout_{LS}$ in the second operation mode, are also equal. The minimum signal values of each of these first, second, third and fourth signal ranges can be identical, such as, e.g., zero.

In the embodiment illustrated in FIG. 4, the first and second signal ranges are larger than the second and third signal ranges, which means that a difference between a maximum signal value and a minimum signal value of the first and second signal ranges is larger than a difference between a maximum signal value and a minimum signal value of the third and fourth signal ranges.

In FIG. 4, $T_{DT-MIN}$ denotes a minimum dead time and $T_{DT-MAX}$ denotes a maximum dead time that can be adjusted by the mode selection element 2. In the embodiment of FIG. 4, the minimum and maximum values are equal in the first and second operation mode. This, however, is only an example. The minimum and maximum values could be different in the first and second mode.

Figure 5:
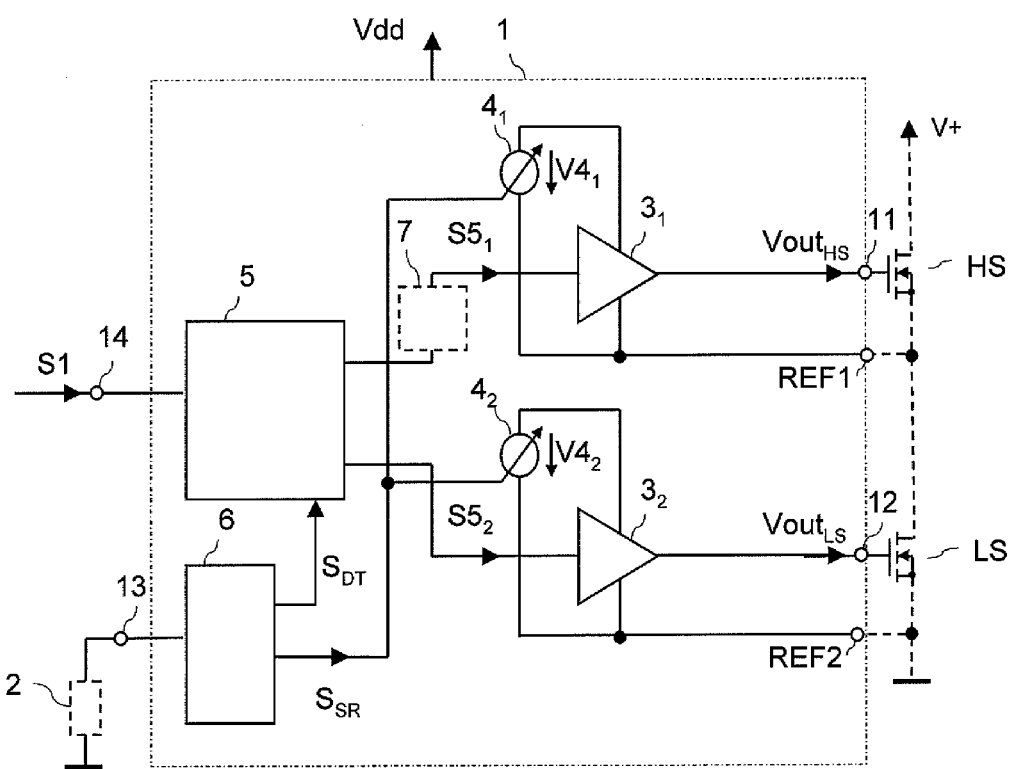
FIG. 5 illustrates a first embodiment of the drive circuit of FIG. 1 in greater detail.

An embodiment of a drive circuit 1 that is configured to adjust dead time $T_{DT}$ and the signal ranges of the first and second drive signals $Vout_{HS}$, $Vout_{LS}$ dependent on a mode selection element 2 is illustrated in greater detail in FIG. 5. The drive circuit 1 according to FIG. 5 has a first driver $3_1$ with an input to receive a first control signal $S5_1$, and an output coupled to the first output terminal 11. The first driver $3_1$ further includes supply terminals for receiving a supply voltage. A first supply voltage source $4_1$ is connected to these supply terminals of the first driver $3_1$. One of the supply terminals is coupled to the first reference terminal REF1. This supply terminal is a negative supply terminal of the driver $3_1$ in the embodiment of FIG. 5.

The drive circuit 1 further includes a second driver $3_2$ with an input to receive a second control signal $S5_2$, and an output coupled to the second output terminal 12. The second driver $3_2$ further includes supply terminals, where a second supply voltage source $4_2$ is connected to these supply terminals. A negative supply terminal of the driver $3_2$ is connected to the second reference terminal REF2. The "negative supply terminals" in the first and second drivers $3_1$, $3_2$ are those supply terminals at which the lowest electrical potentials in the first and second drivers $3_1$, $3_2$ is available.

The drive circuit 1 further includes a control circuit 5 with an input to receive the first input signal S1 and with first and second outputs. At the first output the first control signal $S5_1$ is available, and at the second output the second control signal $S5_2$ is available. The first control signal $S5_1$ controls the high-side switch HS via the first driver $3_1$, and the second control signal $S5_2$ controls the low-side switch LS via the second driver $3_2$. The control circuit 5 generates the first and second drive signals $S5_1$, $S5_2$ from the input signal S1 in accordance with the explanation provided with reference to FIG. 2 such that there is a dead time between the time of switching off one of the switches HS, LS and the time of switching on the other one of the switches HS, LS. The first and second control signals $S5_1$, $S5_2$ can each assume an on-level and an off-level, where the high-side and low-side switches HS, LS are switched on when a corresponding control signal $S5_1$, $S5_2$ assumes an on-level, and the switches are switched off when the corresponding control signal $S5_1$, $S5_2$ assumes an off-level. The control circuit 5 receives a dead time signal $S_{DT}$ and is configured to adjust the dead time in the generation of the first and second control signals $S5_1$, $S5_2$ dependent on the dead time signal $S_{DT}$.

The dead time signal $S_{DT}$ is provided by an evaluation circuit 6 that is connected to the mode selection terminal 13 and that is configured to evaluate the electrical parameter of the mode selection element 2 connected to the mode selection terminal 13. The evaluation circuit 6 is, for example, configured to evaluate an electrical resistance of the mode selection element 2. Evaluating the electrical resistance may, for example, include driving a known and constant current through the mode selection element 2 and detecting a voltage drop across the mode selection element 2. The electrical resistance may be then be obtained by simply dividing the measured voltage through the known current. The evaluation circuit 6 is further configured to generate the dead time signal $S_{DT}$ in accordance with the characteristic curves illustrated in FIG. 4. According to one embodiment, the evaluation circuit 6 includes a lookup-table in which resistance values and corresponding dead time values are stored. In this case, the evaluation circuit 6 reads the dead time value corresponding to the evaluated resistance value from the lookup table and outputs the read dead time value as the dead time signal $S_{DT}$ to the control circuit 5.

The evaluation circuit 6 further provides a signal-range signal $S_{SR}$. The signal-range signal $S_{SR}$ includes information on the signal range that is to be adjusted for the first and second drive signals $Vout_{HS}$, $Vout_{LS}$. In the drive circuit of FIG. 5, these signal ranges are dependent on the supply voltages $V4_1$, $V4_2$, provided by the supply voltage sources $4_1$, $4_2$. The supply voltage sources $4_1$, $4_2$ are adjustable supply voltage sources that each provide the respective output voltage $V4_1$, $V4_2$ dependent on the signal-range signal $S_{SR}$. The drive circuit 1 according to FIG. 5 can assume two operation modes governed by the signal-range signal $S_{SR}$. The signal-range signal $S_{SR}$ can assume two different signal levels dependent on whether the electrical parameter R2 is in the first or second parameter interval [$R2_3$, $R2_4$] or [$R2_6$, $R2_6$], respectively. When the signal-range signal $S_{SR}$ has a signal level indicating the first operation mode, the first supply voltage source $4_1$ generates a first supply voltage defining the first signal range and the second supply voltage source $4_2$ generates a second supply voltage defining the second signal range. When the signal-range signal $S_{SR}$ has a signal level indicating the second operation mode, the first supply voltage source $4_1$ generates a third supply voltage defining the third signal range, and the second supply voltage source $4_2$ generates a fourth supply voltage defining the fourth signal range. The first and second supply voltage sources $4_1$, $4_2$ receive the signal-range signal $S_{SR}$ as a voltage adjustment signal. Adjustable voltage sources, such as the first second voltage sources $4_1$, $4_2$ are commonly known, so that no further explanation is required in this regard.

According to one embodiment, the first and second supply voltages, are equal, and third and fourth supply voltages are equal, where the first and second supply voltages are higher than the third and fourth supply voltages. According to one embodiment, the third and fourth supply voltages are supply voltages having a logic level, such as 5V or 3.3V, in order to drive logic level transistors. The first and second supply voltages are for example, in a range of between 10V and 15V, in order to drive normal level transistors.

Referring to FIG. 5, a level shifter 7 can be arranged between the first output of the control signal 5 and the input of the first driver $3_1$.

Figure 6:
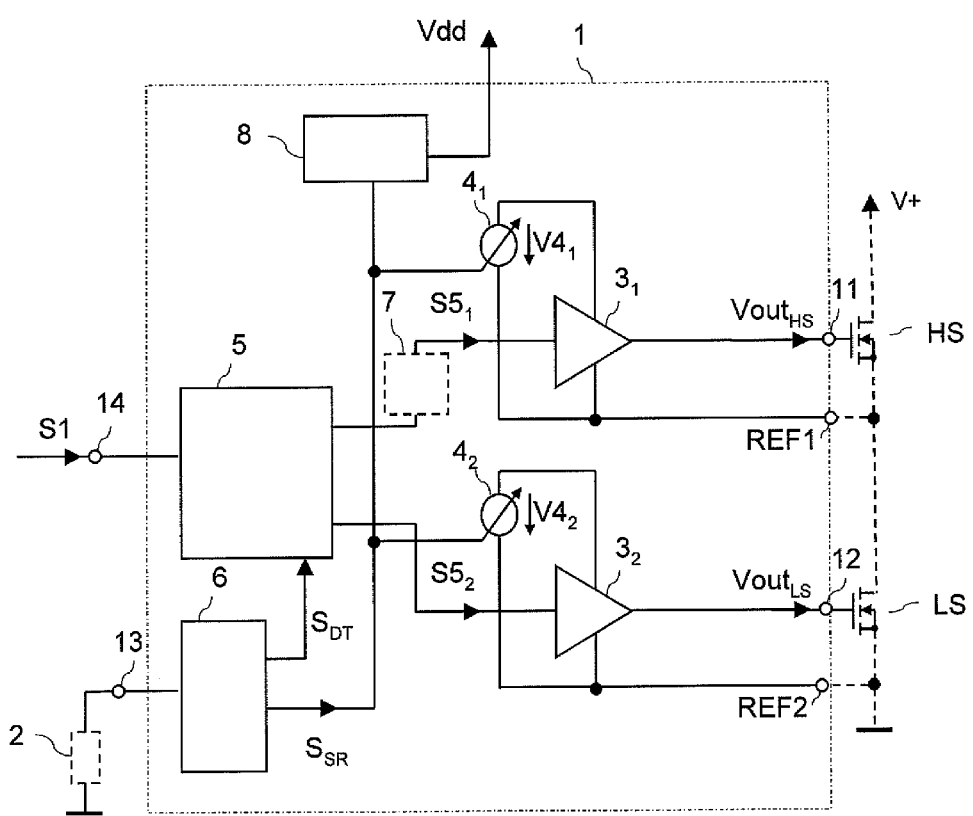
FIG. 6 illustrates a second embodiment of the drive circuit of FIG. 1 in greater detail.

FIG. 6 illustrates a further embodiment of a drive circuit 1. The drive circuit 1 of FIG. 6 is a modification of the drive circuit 1 according to FIG. 5, so that only different or additional features are explained next. Referring to FIGS. 5 and 6 the drive circuit 1 receives a supply voltage Vdd. This supply voltage Vdd supplies the individual circuit blocks of the drive circuit 1 in a manner not explicitly shown in FIG. 5. In particular, the supply voltage Vdd is supplied to the internal supply voltage source $4_1$, $4_2$ and is, therefore, used to generate the internal supply voltages $V4_1$, $V4_2$ the first and second drivers $3_1$, $3_2$ use to generate the drive signals $Vout_{HS}$, $Vout_{LS}$. Referring to FIG. 6, the drive circuit 1 may include an undervoltage detection circuit 8 that receives the external supply voltage Vdd and is configured to evaluate the external supply voltage Vdd. The undervoltage detection circuit 8 further receives the signal-range signal $S_{SR}$ that includes information of the current operation mode of the drive circuit 1. The undervoltage detection circuit 8 is configured to compare the external supply voltage Vdd with a threshold voltage and to deactivate the drive circuit 1 when the external supply voltage Vdd falls below the threshold voltage. The threshold voltage is dependent on the signal-range signal $S_{SR}$, where the threshold voltage has a first value when the drive circuit 1 is in a first operation mode and a second value when the drive circuit 1 is in a second operation mode, where the first value is higher than the second value.

Figure 7:
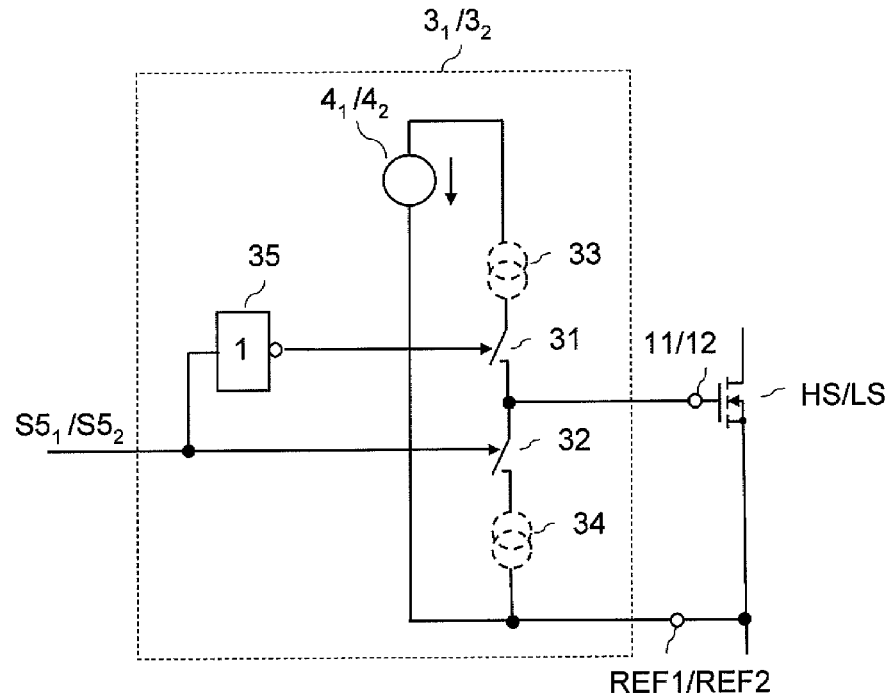
FIG. 7 illustrates an embodiment of a driver of the drive circuits according to FIGS. 5 and 6.

The first and second drivers $3_1$, $3_2$ can be conventional drivers that are configured to generate a drive signal from a supply voltage dependent on an input or control signal. In order to provide a better understanding of the drivers $3_1$, $3_2$ an embodiment of these drivers is illustrated in FIG. 7. The driver illustrated in FIG. 7 can be used to implement each of the first and second drivers $3_1$, $3_2$. For the sake of completeness the corresponding supply voltage source $4_1$ or $4_2$, respectively, is also illustrated in FIG. 7. The driver includes a first switch 31 connected between the first supply terminal and the output, and a second switch 32 connected between the second supply terminal and the output. Optionally, a first current source 33 is connected in series with the first switch 31 and/or a second current source 34 is connected in series with the second switch 32. The current sources 33, 34 serve to limit a charging or discharging current at the output of the driver $3_1$, $3_2$. The first and second switches 31, 32 are driven in a complementary fashion dependent on the control signal $S5_1$/$S5_2$, respectively, so that only one of the switches 31, 32 is switched on at the same time. According to one embodiment, the second switch 32 is switched on and off dependent on the control signal $S5_1$/$S5_2$, while the first switch 31 is switched on and off dependent on the inverted control signal $S5_1$/$S5_2$ that is available at the output of an inverter 35 that receives the control signal $S5_1$/$S5_2$. In the driver $3_1$, $3_2$ of FIG. 7 the first switch 31 is switched on when the control signal $S5_1$, $S5_2$ has an on-level. In this case, the drive voltage $Vout_{HS}$, $Vout_{LS}$ between the output 11/12 and the reference terminal REF1/REF2 corresponds to the supply voltage $V4_1$/$V4_2$. When the control signal $S5_1$/$S_2$ has an off-level, the second switch 32 is switched on. In this case, the drive voltage $Vout_{HS}$/$Vout_{LS}$ is zero (0). The first and second switches 31, 32 can be implemented as conventional electronic switches, such as MOSFETs, IGBTs, BJTs, or the like.

Figure 8:
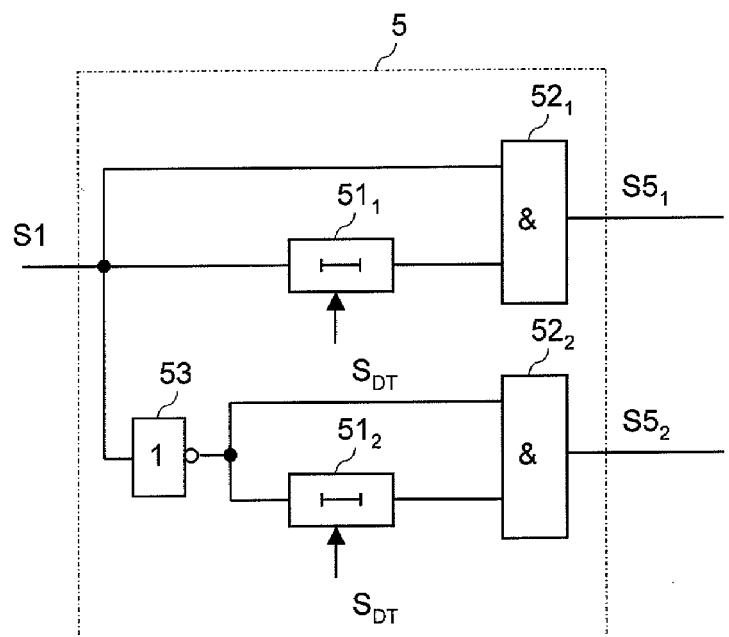
FIG. 8 illustrates an embodiment of a control circuit of the drive circuits according to FIGS. 5 and 6.

FIG. 8 illustrates an embodiment of the control circuit 5 that generates the first and second control signals $S5_1$, $S5_2$. Referring to FIG. 8, the control circuit 5 has first and second adjustable delay elements $51_1$, $51_2$ each of which receives the dead time signal $S_{DT}$. These delay elements $51_1$, $51_2$ are configured to delay an input signal with a delay time adjusted by the dead time signal $S_{DT}$. The first delay element $51_1$ receives the input signal S1 of the drive circuit as an input signal, and the second delay element $51_2$ receives the inverted input signal S1 that is available at the output of an inverter 53 as an input signal. The first control signal $S5_1$ is available at a logic gate $52_1$, such as an AND gate, that receives the output signal of the first delay element $51_1$ and the input signal S1. The second control signal $S5_2$ is available at the output of a further logic gate $52_2$, such as an AND gate, that receives the output signal of the second delay element $51_2$ and the inverted input signal available at the output of the inverter 53 as input signals.

The block diagrams illustrated in FIGS. 5 to 8 serve to illustrate the operating principle of the individual circuits, rather than the implementation. The individual circuit block illustrated in these figures can be implemented using analog or digital circuits or can be implemented using a processor, such as a microprocessor, and software.

Figure 9:
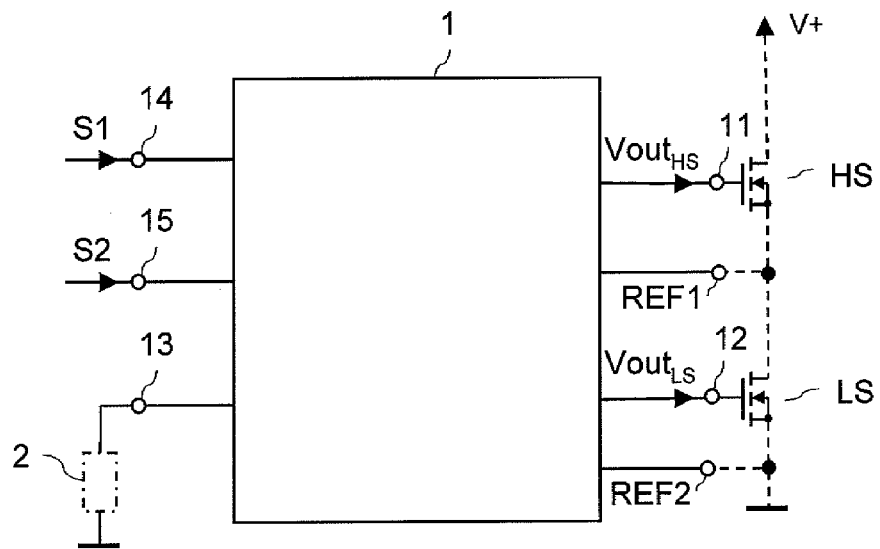
FIG. 9 schematically illustrates a further embodiment of a drive circuit generating first and second drive signals.

FIG. 9 illustrates a further embodiment of a drive circuit 1. This drive circuit is based on the drive circuit illustrated in FIG. 1 and is different from the drive circuit in FIG. 1 in that it includes a second input terminal 15 for receiving a second input signal S2. The drive circuit 1 of FIG. 9 can operate in two different operation modes, an internal dead-time generation mode, and an external dead-time generation mode. In the internal dead-time generation mode the drive circuit 1 may operate in the same way as the drive circuit 1 explained with reference to FIGS. 1 to 8, which means the first and second drive signals $Vout_{HS}$, $Vout_{LS}$ are generated dependent on the first input signal S1 and with dead times and signal ranges defined by the mode selection element 2 connected to the mode selection terminal 13. In the external dead-time generation mode the first drive signal $Vout_{HS}$ is generated from the first input signal S1 and the second drive signal $Vout_{LS}$ is generated from the second input signal S2. A dead time between the time of an off-level of one drive signal and the time of an on-level of the other drive signal is in this case only defined by a timing of the first and second input signals S1, S2.

The drive circuit 1 operates in the internal dead-time generation mode or the external dead-time generation mode dependent on the electrical parameter of the mode selection element 2. According to one embodiment, the signal ranges of the first and second drive signals $Vout_{HS}$, $Vout_{LS}$ are adjustable in the external dead-time generation mode in the same way as in the internal dead-time generation mode.

Figure 10:
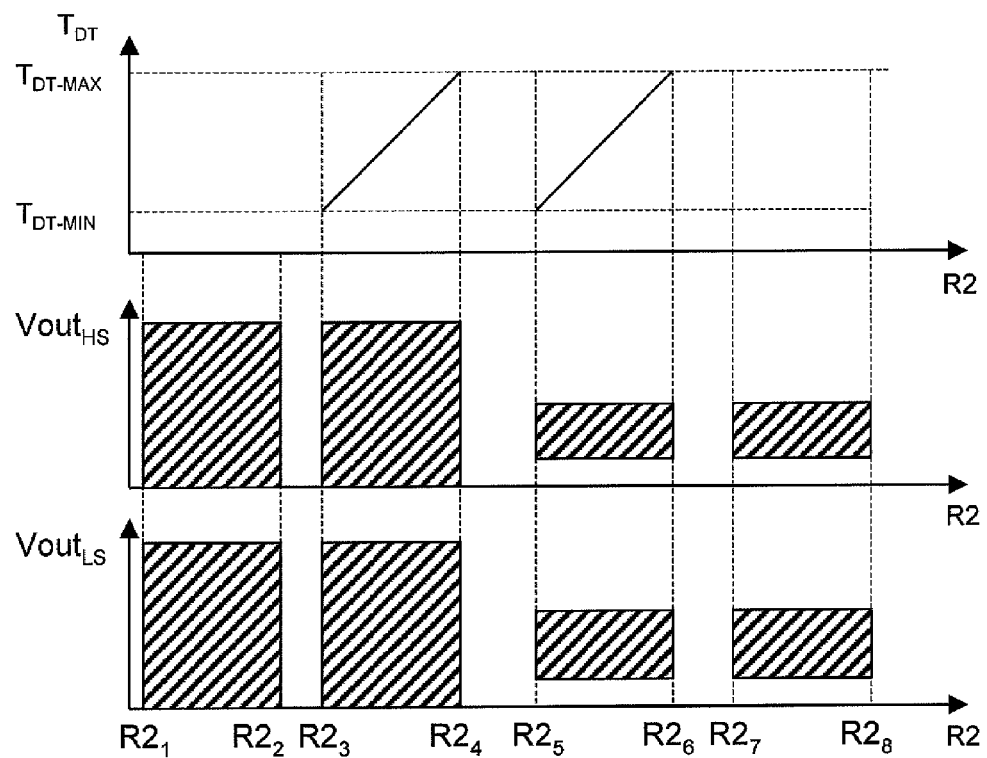
FIG. 10 illustrates the operating principle of the drive circuit of FIG. 9 as to the generation of the dead time, as to the selection of signal ranges of first and second drive signals, and as to the generation of first and second drive signals.

The operating principle of the drive circuit 1 of FIG. 9 is explained next with reference to FIG. 10 in which the dead time $T_{DT}$ dependent on the electrical parameter R2, and the signal ranges of the first and second drive signals $Vout_{HS}$, $Vout_{LS}$ dependent on the electrical parameter R2 are schematically illustrated. When the electrical parameter R2 is in the first interval [$R2_3$, $R2_4$] and in the second interval [$R2_6$, $R2_6$], respectively, the drive circuit 1 operates as explained with reference to FIGS. 4 to 8. The first and second operation modes explained before are sub-modes of the internal dead-time generation mode in the drive circuit 1 of FIG. 9.

The drive circuit 1 is in the external dead-time generation mode when the external parameter R2 is in a further parameter range that includes two sub-ranges or intervals, namely a third interval [$R2_1$, $R2_2$], and a fourth interval [$R2_7$, $R2_8$]. When the electrical parameter R2 is in the third interval [$R2_1$, $R2_2$] the signal ranges of the first and second drive signals $Vout_{HS}$, $Vout_{LS}$ correspond to the signal ranges in the first operation mode, while the signal ranges correspond to the signal ranges in a second operation mode when the electrical parameter R2 is in the fourth interval [$R2_7$, $R2_8$]. However, this is only an example. The signal ranges when the electrical parameter R2 is in the third and fourth interval can be different from the signal ranges in the first and second operation modes, respectively.

Figure 11:
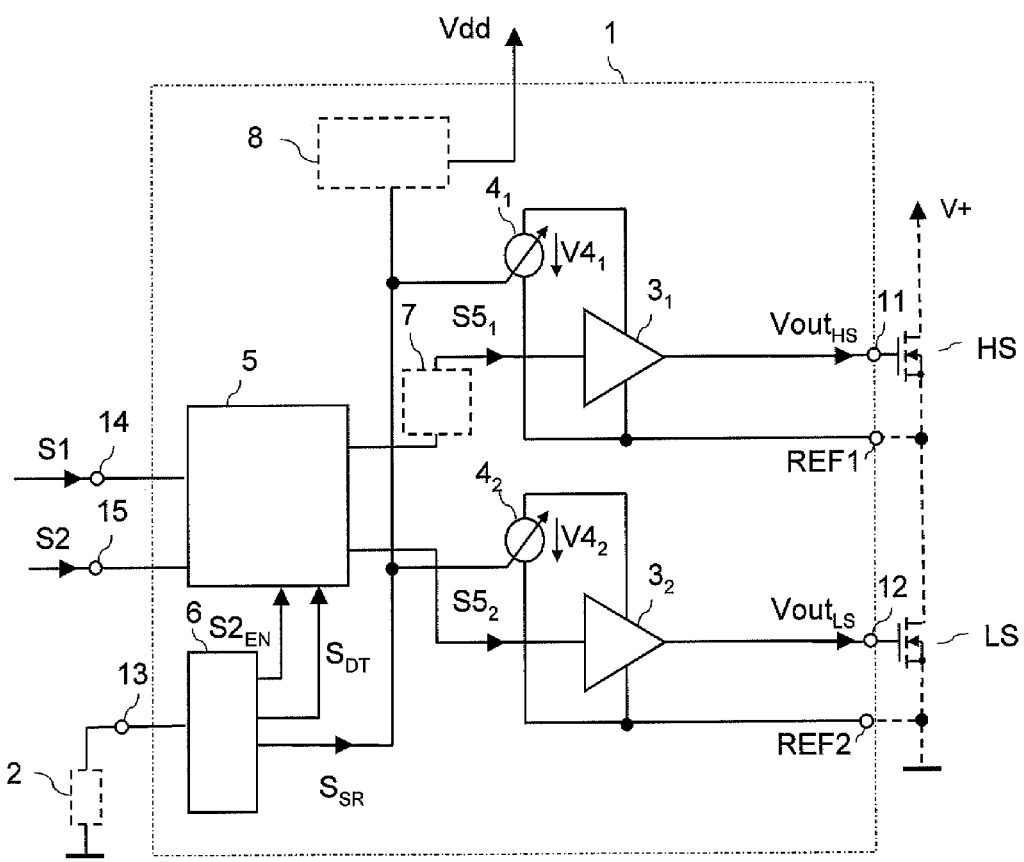
FIG. 11 illustrates an embodiment of the drive circuit of FIG. 9 in detail.

FIG. 11 illustrates an embodiment of the drive circuit 1 of FIG. 9 in greater detail. In this embodiment, the evaluation circuit 6 generates the signal-range signal $S_{SR}$, the delay time signal $S_{DT}$ and an enable signal $S2_{EN}$ that enables the second input signal S2 for the generation of the second control signal $S5_2$. The control circuit 5 receives the enable signal $S2_{EN}$. The generation of the delay time signal $S_{DT}$ corresponds to the generation of the delay time signal explained with reference to FIG. 5. The generation of the signal-range signal $S_{SR}$ corresponds to the generation of the signal-range signal $S_{SR}$ explained with reference to FIG. 5, while the signal-range signal $S_{SR}$ according to FIG. 11 also has the first signal level that indicates a higher signal range of the first and second drive signals $Vout_{HS}$, $Vout_{LS}$ when the electrical parameter R2 as evaluated by the evaluation circuit 6 is in the third interval [$R2_1$, $R2_2$]. Consequently, the signal-range signal $S_{SR}$ has the second signal level when the electrical parameter R2 is in the fourth interval [$R2_7$, $R2_8$].

Figure 12:
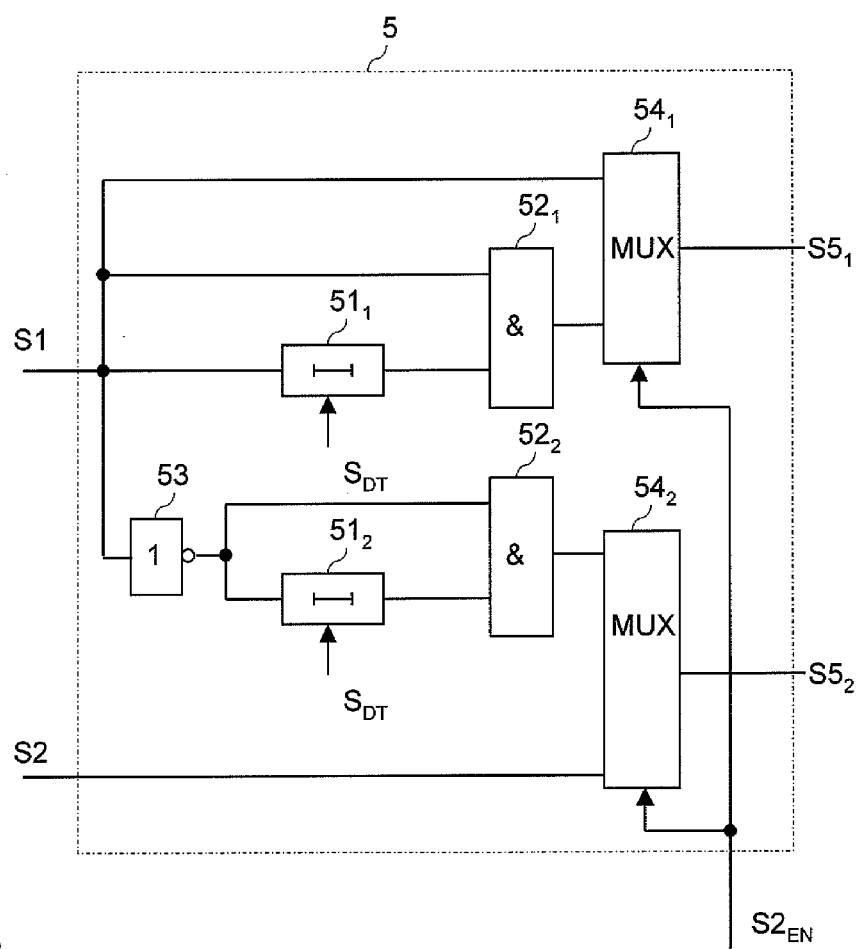
FIG. 12 illustrates an embodiment of a control circuit of the drive circuit of FIG. 11 in detail.

An embodiment of the control circuit 5 of FIG. 11 is illustrated in FIG. 12. The control circuit 5 of FIG. 12 is based on the control circuit of FIG. 8 and additionally includes a first multiplexer $54_1$ and a second multiplexer $54_2$. The multiplexers $54_1$, $54_2$ are controlled by the enable signal $S2_{EN}$. The first multiplexer $54_1$ receives the first input signal S1 and the output signal of the first logic gate $52_1$. The second multiplexer $54_1$ receives the second input signal S2 and the output signal of the second logic gate $52_2$. When the enable signal $S2_{EN}$ has a signal level indicating that the drive circuit 1 is in the external dead-time generation mode, the first multiplexer $54_1$ passes through the first input signal S1, and the second multiplexer $54_2$ passes through the second input signal S2.

When the enable signal $S2_{EN}$ indicates that the drive circuit 1 is in the internal dead-time generation mode the multiplexers $54_1$, $54_2$ pass through the output signals of the corresponding logic gates $52_1$, $52_2$.

Figure 13:
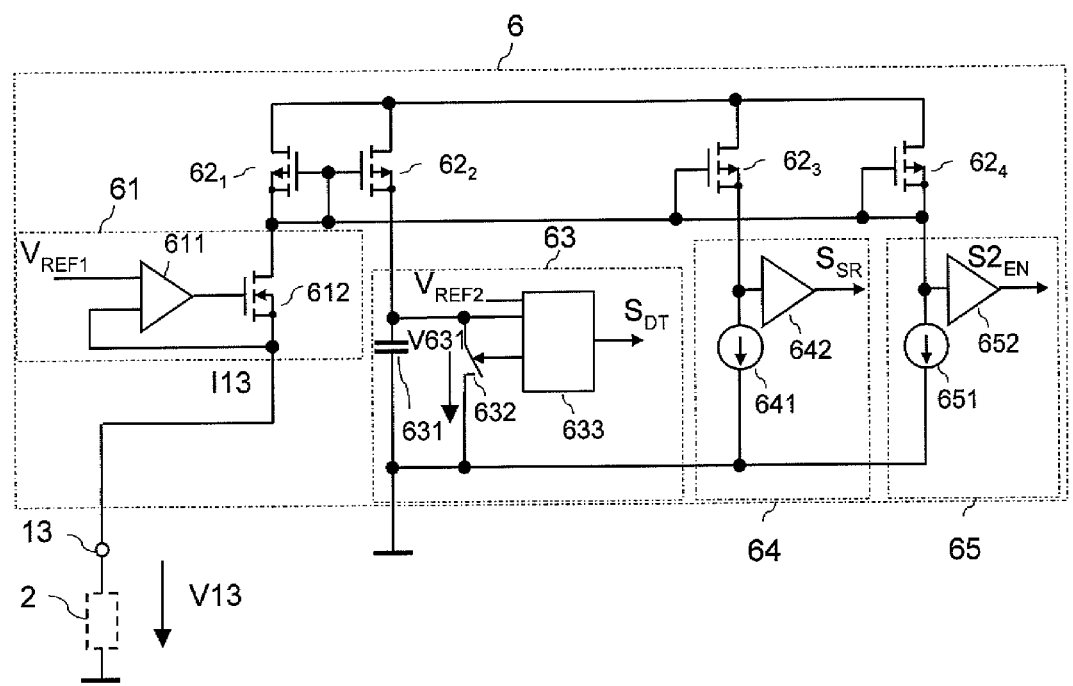
FIG. 13 illustrates an embodiment of the evaluation circuit.

FIG. 13 illustrates an embodiment of an evaluation circuit 6 that provides the dead time signal $S_{DT}$, the signal-range signal $S_{SR}$, and the enable signal $S2_{EN}$. Referring to FIG. 13, the evaluation circuit 6 includes a voltage regulator 61 connected to the mode selection terminal 13. The voltage regulator 61 is configured to drive an output current I13 via the mode selection terminal 13 through the mode selection element 2 such that a voltage drop V13 across the mode selection element 2 equals a reference voltage $V_{REF1}$. For explanation purposes it is assumed that the mode selection element 2 is an ohmic resistor having a resistance R2. In this case, the output current I13 is proportional to the ohmic resistance R2 as follows:

$$I13=V13/R2=V_{REF1}/R2 \qquad (1)$$

In the embodiment illustrated in FIG. 13, the voltage regulator 61 includes a transistor 612 having a load path and a control terminal. The load path of the transistor 612 is coupled to the mode selection terminal 13. This transistor 612 is driven by an operational amplifier 612 that receives the reference voltage $V_{REF1}$ at a first input terminal and the voltage V13 across the mode selection element 2 at a second terminal. The transistor 612 is operated as a variable current source that provides the output current I13 dependent on the reference voltage $V_{REF1}$ and the voltage V13 across the mode selection element 2.

The evaluation circuit 6 further includes a current mirror with an input transistor $62_1$ and three output transistors $62_2$, $62_3$, $62_4$. The input transistor $62_1$ is connected in series with the transistor 612 of the voltage regulator 61, so that the output current I13 flows through the input transistor $62_1$, The current mirror mirrors the output current I13 via the output transistors $62_2$, $62_3$, $62_4$ to three evaluation units 63, 64, 65. The current mirror ratio between the input transistor $62_1$ and the output transistors $62_2$, $62_3$, $62_4$ can be 1:1, but could also be different from 1:1. In the first case the currents provided by the output transistors $62_2$, $62_3$, $62_4$ equals the output current I13. In the second case, the currents provided by the output transistors $62_2$, $62_3$, $62_4$ are proportional to the output current I13.

A first evaluation unit 63 generates the delay time signal $S_{DT}$. The first evaluation unit 63 includes a capacitor 631 connected in series with the first output transistor $62_2$, and a switch 632 connected in parallel with the capacitor 631. This switch 632 can be implemented as a conventional electronic switch, such as a transistor. A control logic 633 controls the switch 632 and evaluates a voltage V631 across the capacitor 631. When the switch 632 is switched off (open) the capacitor 631 is charged through the current provided by the first output transistor $62_2$. The control logic 633 is configured to evaluate a time difference between two charging states of the capacitor 631. According to one embodiment a first charging state is a charging state when the capacitor 631 is discharged, i.e. when the second switch 632 is switched on (closed). A second charging state is a charging state when the voltage V631 across the capacitor 631 equals a second reference voltage $V_{REF2}$ provided to the control logic 633. The time difference is proportional to the current provided by the first output transistor $62_2$, is proportional to the output current I13, and is, therefore, proportional to the ohmic resistor R2 of the mode selection element 2. The control logic 633 is configured to generate the delay time signal $S_{DT}$ dependent on the evaluated time difference.

A second evaluation unit 64 receives an output current from the second output transistor $62_3$. This second evaluation unit 64 includes a current source 641 connected in series with the second output transistor $62_3$, and a comparator 642 that compares the electrical potential at a circuit node between the second output transistor $62_3$ and the current source 641 with an in channel reference voltage. When the current provided by the second output transistor $62_3$ is below the current provided by the current source 641 the comparator 642 generates the signal-range signal $S_{SR}$ with a first signal level, and when the current provided by the second output transistor $62_3$ is above the current provided by the current source 641, the comparator 642 generates the signal-range signal $S_{SR}$ with a second signal level.

The third evaluation unit 65 is equivalent to the second evaluation unit 64 and includes a further current source 651 and a further comparator 652. The comparator 652 generates the enable signal $S2_{EN}$. The second current source 651 may generate a current that is different from the current provided by the first current source 641, so that the signal-range signal $S_{SR}$ and the enable signal $S2_{EN}$ are provided dependent on different thresholds.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific Figure may be combined with features of other Figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A drive circuit, comprising:
   a first input terminal configured to receive a first input signal;
   a first output terminal configured to provide a first drive signal;
   a second output terminal configured to provide a second drive signal; and
   a mode selection terminal configured to have a mode selection element connected thereto;
   wherein the drive circuit is configured to generate the first and second drive signals dependent on the first input signal such that there is a dead time between a time when one of the first and second drive signals assumes an off-level and a time when the other one of the first and second drive signals assumes an on-level; and
   wherein the drive circuit is further configured to evaluate at least one electrical parameter of the mode selection element and is configured to adjust a maximum signal level of the first drive signal and a maximum signal level of the second drive signal dependent on the evaluated parameter and to adjust the dead time dependent on the evaluated parameter.

2. The drive circuit of claim 1, wherein the mode selection element is a resistance and wherein the electrical parameter is a resistance.

3. The drive circuit of claim 1, wherein the drive circuit is further configured to adjust the maximum signal level of the first drive signal to a first maximum signal level and the maximum signal level of the second drive signal to a second maximum signal level and to adjust the dead time dependent on the electrical parameter when the electrical parameter is in a first parameter range, and to adjust the maximum signal level of the first drive signal to a third maximum signal level and the maximum signal level of the second drive signal to a fourth maximum signal level and to adjust the dead time dependent on the electrical parameter when the electrical parameter is in a second parameter range.

4. The drive circuit of claim 3, wherein the dead time is linearly dependent on the resistance when the electrical parameter is in the first or second parameter range.

5. The drive circuit of claim 1, further comprising an evaluation circuit coupled to the mode selection terminal and configured to evaluate the at least one electrical parameter of the mode selection element and to provide a dead-time signal and a signal-range signal dependent on the evaluated electrical parameter.

6. The drive circuit of claim 5, further comprising:
   a first drive circuit comprising an input to receive a first control signal, an output coupled to the first output terminal, and supply terminals;
   a first supply voltage source coupled to the supply terminals of the first drive circuit, the first supply voltage source configured to receive the signal-range signal and to generate a supply voltage dependent on the signal-range signal;
   a second drive circuit comprising an input to receive a second control signal, an output coupled to the second output terminal, and supply terminals;
   a second supply voltage source coupled to the supply terminals of the second drive circuit, the second supply voltage source configured to receive the signal-range signal and to generate a supply voltage dependent on the signal-range signal; and
   a control circuit coupled to the first input terminal, configured to receive the dead-time signal and generate the first and second control signals dependent on the input signal and the dead-time signal.

7. The drive circuit of claim 6,
   wherein the evaluation circuit is configured to generate the signal-range signal with one of a first signal level and a second signal level,
   wherein the first supply voltage circuit is configured to provide a supply voltage with a first voltage level or with a second voltage level dependent on the signal-range signal, and
   wherein the second supply voltage circuit is configured to provide a supply voltage with a third voltage level or with a fourth voltage level dependent on the signal-range signal.

8. The drive circuit of claim 7, wherein the first voltage level equals the third voltage level and the second voltage level equals the fourth voltage level.

9. The drive circuit of claim 6, further comprising:
   a first reference terminal and a second reference terminal;
   wherein the first drive circuit is configured to provide a first drive voltage as a first drive signal between the first output terminal and the first reference terminal; and
   wherein the second drive circuit is configured to provide a second drive voltage as a second drive signal between the second output terminal and the second reference terminal.

10. The drive circuit of claim 6, wherein the control circuit is configured to generate one of an on-level and an off-level of the first and second control signals dependent on the input signal.

11. The drive circuit of claim 7,
    wherein the first drive circuit is configured to generate the first drive signal to be zero when the first control signal has an off-level and to have a signal level corresponding to the supply voltage provided by the first supply voltage circuit when the first control signal has an on-level, and
    wherein the second drive circuit is configured to generate the second drive signal to be zero when the second control signal has an off-level and to have a signal level corresponding to the supply voltage provided by the second supply voltage circuit when the second control signal has an on-level.

12. A drive circuit, comprising:
    a first input terminal configured to receive a first input signal;
    a second input terminal configured to receive a second input signal;
    a first output terminal configured to provide a first drive signal;
    a second output terminal configured to provide a second drive signal; and
    a mode selection terminal configured to have a mode selection element connected thereto;
    wherein the drive circuit is configured to assume an internal dead-time generation mode in which the first and second drive signals are generated dependent on the first input signal such that there is a dead time between a time when one of the first and second drive signals assumes an off-level and a time when the other one of the first and second drive signals assumes an on-level, and to assume an external dead-time generation mode in which the first drive signal is dependent on the first input signal and in which the second drive signal is dependent on the second input signal; and wherein the drive circuit is further configured to evaluate at least one electrical parameter of the mode selection element and adjust the first operation mode or the second operation mode dependent on the evaluated parameter.

13. The drive circuit of claim 12, wherein the drive circuit is further configured in the internal dead-time generation mode to adjust a first signal range of the first drive signal and a second signal range of the second drive signal dependent on the evaluated parameter and to adjust the dead time dependent on the evaluated parameter.

14. The drive circuit of claim 13, wherein the mode selection element is a resistance and wherein the electrical parameter is a resistance.

15. The drive circuit of claim 13, wherein the drive circuit is further configured to operate in the internal dead-time generation mode when the electrical parameter is in a first parameter range and to operate in the external dead-time generation mode when the electrical parameter is in a second parameter range.

16. The drive circuit of claim 15, wherein the drive circuit is further configured:
to adjust the first signal range to a first range and the second signal range to a second range and to adjust the dead time dependent on the electrical parameter when the electrical parameter is in a first sub-range of the first parameter range; and
to adjust the second signal range to a third range and the second signal range to a fourth range and to adjust the dead time dependent on the electrical parameter when the electrical parameter is in a second sub-range of the first parameter range.

17. The drive circuit of claim 16, wherein the dead time is linearly dependent on the electrical parameter when the electrical parameter is in the first or second sub-range.

18. The drive circuit of claim 12, further comprising an evaluation circuit coupled to the mode selection terminal and configured to evaluate the at least one electrical parameter of the mode selection and to provide a dead-time signal, a signal-range signal and an enable signal dependent on the evaluated electrical parameter.

19. The drive circuit of claim 18, further comprising:
a first drive circuit comprising an input to receive a first control signal, an output coupled to the first output terminal, and supply terminals;
a first supply voltage source coupled to the supply terminals of the first drive circuit, the first supply voltage source configured to receive the signal-range signal and to generate a supply voltage dependent on the signal range signal;
a second drive circuit comprising an input to receive a second control signal, an output coupled to the second output terminal, and supply terminals;
a second supply voltage source coupled to the supply terminals of the second drive circuit, the second supply voltage source configured to receive the signal-range signal and to generate a supply voltage dependent on the signal range signal; and
a control circuit coupled to the first input terminal and the second input terminal, configured to receive the dead-time signal and configured to generate the first and second control signals dependent on the input signal and the dead-time signal.

20. The drive circuit of claim 19,
wherein the evaluation circuit is configured to generate the signal-range signal with one of a first signal level and a second signal level,
wherein the first supply voltage circuit provides a supply voltage with a first voltage level or with a second voltage level dependent on the signal-range signal, and
wherein the second supply voltage circuit provides a supply voltage with a third voltage level or with a fourth voltage level dependent on the signal-range signal.

21. The drive circuit of claim 20, wherein the first voltage level equals the third voltage level and the second voltage level equals the fourth voltage level.

22. The drive circuit of claim 19, further comprising:
a first reference terminal and a second reference terminal;
wherein the first drive circuit is configured to provide a first drive voltage as a first drive signal between the first output terminal and the first reference terminal; and
wherein the second drive circuit is configured to provide a second drive voltage as a second drive signal between the second output terminal and the second reference terminal.

23. The drive circuit of claim 19, wherein the control circuit is configured to generate one of an on-level and an off-level of the first and second control signals dependent on the input signal.

24. The drive circuit of claim 20,
wherein the first drive circuit is configured to generate the first drive signal to be zero when the first control signal has an off-level and to have a signal level corresponding to the supply voltage provided by the first supply voltage circuit when the first control signal has an on-level, and
wherein the second drive circuit is configured to generate the second drive signal to be zero when the second control signal has an off-level and to have a signal level corresponding to the supply voltage provided by the second supply voltage circuit when the second control signal has an on-level.

25. The drive circuit of claim 19, wherein the control circuit is configured to generate dependent on the enable signal the first and second control signals from the first input signal or the first control signal from the first input signal and the second control signal from the second input signal.

* * * * *